(12) United States Patent
Matsuura et al.

(10) Patent No.: US 7,807,587 B2
(45) Date of Patent: Oct. 5, 2010

(54) SUBSTRATE PROCESSING APPARATUS AND SUBSTRATE PROCESSING METHOD

(75) Inventors: Hiroyuki Matsuura, Oshu (JP); Ken Nakao, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/083,342

(22) PCT Filed: Oct. 6, 2006

(86) PCT No.: PCT/JP2006/320118

§ 371 (c)(1),
(2), (4) Date: Mar. 3, 2009

(87) PCT Pub. No.: WO2007/043478

PCT Pub. Date: Apr. 19, 2007

(65) Prior Publication Data

US 2009/0305512 A1   Dec. 10, 2009

(30) Foreign Application Priority Data

Oct. 11, 2005   (JP) .............................. 2005-296389

(51) Int. Cl.
*H01L 21/00* (2006.01)
(52) U.S. Cl. ..................................... 438/800
(58) Field of Classification Search ........................ None
See application file for complete search history.

(56) References Cited

U.S. PATENT DOCUMENTS 6,369,361 B2 *   4/2002   Saito et al. .................. 219/390

6,884,295 B2 *   4/2005   Ishii et al. ................... 118/715

(Continued)

FOREIGN PATENT DOCUMENTS

JP   2-156523   6/1990

(Continued)

OTHER PUBLICATIONS

PCT Notification of Transmittal of Translation of the International Preliminary Examination Report (Form PCT/IB/338) dated Jan. 2004.

(Continued)

*Primary Examiner*—Scott B Geyer
(74) *Attorney, Agent, or Firm*—Smith, Gambrell & Russell, LLP

(57) ABSTRACT

The present invention is a substrate processing apparatus including: a holder that holds substrates in a tier-like manner; a processing container that contains the holder and that conducts a predetermined thermal process to the substrates in a process-gas atmosphere under a predetermined temperature and pressure; a gas-introducing part that introduces a process gas into the processing container; a gas-discharging part that discharges a gas from the processing container to create a predetermined vacuum pressure therein; and a heating part that heats the processing container; wherein the holder is provided with baffle plates each of which forms a processing space for each substrate when the holder is contained in the processing container; the gas-introducing part is provided with gas introduction holes disposed at one lateral side of the respective processing spaces; and the gas-discharging part is provided with gas discharge holes disposed at the other lateral side of the respective processing spaces, oppositely to the gas introduction holes.

6 Claims, 5 Drawing Sheets

U.S. PATENT DOCUMENTS

| | | | |
|---|---|---|---|
| 6,903,030 B2 * | 6/2005 | Ishii et al. | 438/782 |
| 7,135,659 B2 * | 11/2006 | Ejima | 219/497 |
| 2003/0049372 A1 * | 3/2003 | Cook et al. | 427/248.1 |
| 2005/0121145 A1 * | 6/2005 | Du Bois et al. | 156/345.33 |
| 2005/0211264 A1 * | 9/2005 | Kostenko et al. | 134/1.1 |
| 2005/0221001 A1 * | 10/2005 | Joe et al. | 427/248.1 |
| 2006/0162861 A1 * | 7/2006 | O'Meara et al. | 156/345.24 |
| 2007/0243317 A1 * | 10/2007 | Du Bois et al. | 427/98.9 |
| 2007/0259110 A1 * | 11/2007 | Mahajani et al. | 427/248.1 |
| 2008/0035055 A1 * | 2/2008 | Dip et al. | 118/715 |

FOREIGN PATENT DOCUMENTS

| | | |
|---|---|---|
| JP | 3-24718 | 2/1991 |
| JP | 3-50324 | 5/1991 |
| JP | 2000-208425 | 7/2000 |
| JP | 2002-222806 | 8/2002 |
| JP | 2003-45864 | 2/2003 |
| WO | 2005/031803 | 4/2005 |

OTHER PUBLICATIONS

PCT International Preliminary Report on Patentability (Form PCT/IPEA/409) dated Apr. 2005.

Supplementary European Search Report issued on May 10, 2010 for European Application No. 06 81 1445.

* cited by examiner

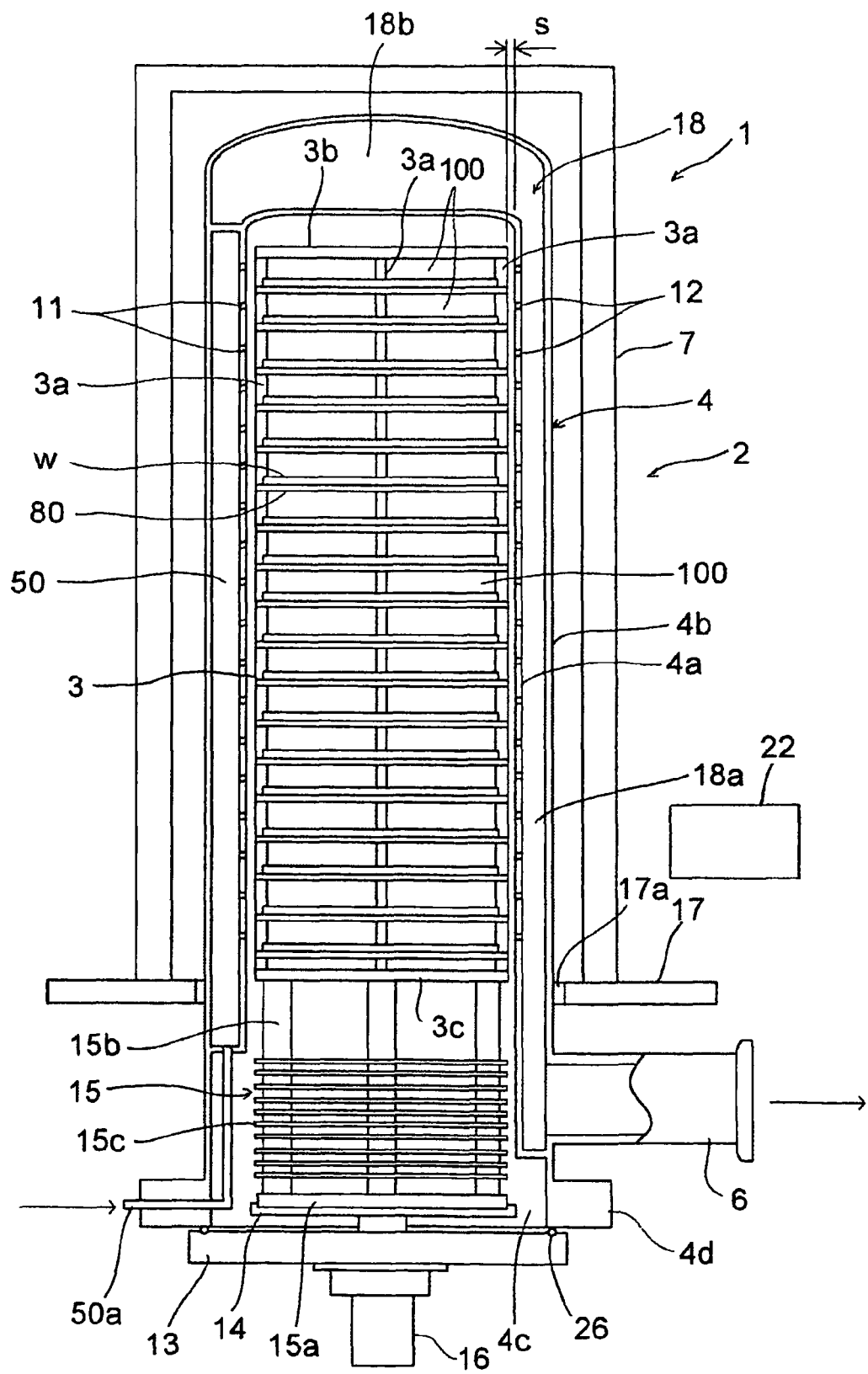
F I G . 4

SUBSTRATE PROCESSING APPARATUS AND SUBSTRATE PROCESSING METHOD

FIELD OF THE INVENTION

The present invention relates to a substrate processing apparatus and a substrate processing method capable of achieving sufficient film-forming uniformity among substrates and of efficiently purging a gas existing between substrates, in a film-forming process to surfaces of a large number of substrates to be processed at a time.

BACKGROUND ART

In manufacturing a semiconductor device, there is a film-forming step wherein a film is formed on a substrate to be processed, such as a semiconductor wafer, by a CVD or the like. As one of processing apparatuses for carrying out the film-forming step, there is known a vertical type of thermal processing apparatus, which is a batch type of processing apparatus that can thermally process a large number of wafers at a time.

The processing apparatus consists of: a boat (holder) that holds wafers in a tier-like manner; a reaction tube (processing container) that contains the boat and that conducts a predetermined thermal process such as a CVD to the wafers in a process-gas (reaction-gas) atmosphere under a predetermined temperature and pressure; a gas-introducing part that introduces a process gas into the reaction tube; a gas-discharging part that discharges a gas from the reaction tube to create a predetermined vacuum pressure therein; and a heater (heating part) that heats the reaction tube. In the processing apparatus structured like the above, the process gas is introduced from one end, such as a lower end, of the reaction tube, rises up in the reaction tube, passes through a substrate-holding area thereof, and is discharged from the other end, such as an upper end, of the reaction tube.

In the processing apparatus, depending on process conditions (temperature, gas flow rate, pressure, processing time), absorption amount of process-gas molecules is greater at an area nearer to the introduction side of the process gas. Thus, it is difficult to obtain sufficient film-forming uniformity among the substrates in the same batch.

On the other hand, an ALD (Atomic Layer Deposition) process, which is one of film-forming processes, is a process in which a film is formed on a substrate by causing a plurality of kinds of gases to flow independently within a short time and sequentially into the reaction tube. In the ALD process, in order to improve the productivity, it is necessary to efficiently purge the gas within a short time after the absorption of the process gas. However, in the above processing apparatus, it is difficult to efficiently purge the gas staying between the substrates. That is, it is not sufficient to achieve the improvement of the productivity.

In Japanese Patent laid-Open Publication No. 2000-208425, there is described a processing apparatus (semiconductor-device manufacturing apparatus) in which a process gas is horizontally supplied from gas nozzles disposed at one lateral side of wafers held on a boat and is discharged from absorption holes disposed oppositely to the gas nozzles. In the processing apparatus, circular barrier plates are provided inside the reaction tube and outer circular parts corresponding to the circular barrier plates are provided at wafer-holding shelf portions of the boat, in such a manner that a layer of the process gas ejected from one gas nozzle doesn't mix with the other layers of the process gas effected from the upper or lower gas nozzles substantially.

However, since this processing apparatus is provided with the circular barrier plates inside the reaction tube and with the outer circular parts at the wafer-holding shelf portions of the boat, the structure is complicated and the size of the apparatus including the reaction tube is unavoidably enlarged.

In addition, in each wafer-holding shelf portion of the boat, pins are provided to protrude therefrom for supporting a wafer at a higher level in order to cause a part of the process gas flowing on or above the wafer to flow under the wafer, so that a film formed on an under surface of the wafer can have a sufficient thickness. Furthermore, in each wafer-holding shelf portion of the boat, a plurality of large openings is formed to expose the reverse (under) side of the wafer. Thus, it is possible that the upper layer of the process gas and the lower layer of the process gas substantially mix with each other through the openings, so that it is difficult to obtain sufficient film-forming uniformity among the substrates. In addition, it is also difficult to efficiently purge the gas staying between the substrates.

SUMMARY OF THE INVENTION

This invention is intended to solve the above problems. The object of this invention is to provide a substrate processing apparatus and a substrate processing method capable of achieving sufficient film-forming uniformity among substrates and of efficiently purging a gas existing between substrates, in a film-forming process to surfaces of a large number of substrates to be processed at a time. In addition, the object of this invention is to provide a substrate processing apparatus and a substrate processing method capable of simplifying structure and of downsizing the apparatus including a processing container.

This invention is a substrate processing apparatus comprising: a holder that holds substrates in a tier-like manner; a processing container that contains the holder and that conducts a predetermined thermal process to the substrates in a process-gas atmosphere under a predetermined temperature and pressure; a gas-introducing part that introduces a process gas into the processing container; a gas-discharging part that discharges a gas from the processing container to create a predetermined vacuum pressure therein; and a heating part that heats the processing container; wherein the holder is provided with baffle plates each of which forms a processing space for each substrate when the holder is contained in the processing container; the gas-introducing part is provided with gas introduction holes disposed at one lateral side of the respective processing spaces; and the gas-discharging part is provided with gas discharge holes disposed at the other lateral side of the respective processing spaces, oppositely to the gas introduction holes.

According to the above invention, in conducting a film-forming process to the surfaces of a large number of substrates to be processed at a time, it is made possible to achieve sufficient film-forming uniformity among the substrates and to efficiently purge the gas existing between the substrates. Thus, the productivity is improved. In addition, simplification of the structure and downsizing of the apparatus including the processing container are also made possible.

Alternatively, this invention is a substrate processing apparatus comprising: a holder that holds substrates in a tier-like manner; a processing container that contains the holder and that conducts a predetermined thermal process to the substrates in a process-gas atmosphere under a predetermined temperature and pressure; a gas-introducing part that introduces a process gas into the processing container; a gas-discharging part that discharges a gas from the processing container to create a predetermined vacuum pressure therein; and a heating part that heats the substrates placed in the processing container; wherein the holder is provided with placing plates for placing the substrates, each placing plate being formed as a circular baffle plate for forming a processing space for each substrate when the holder is contained in the processing container; the gas-introducing part is provided with gas introduction holes disposed at one lateral side of the respective processing spaces; and the gas-discharging part is provided with gas discharge holes disposed at the other lateral side of the respective processing spaces, oppositely to the gas introduction holes.

According to the above invention as well, in conducting a film-forming process to the surfaces of a large number of substrates to be processed at a time, it is made possible to achieve sufficient film-forming uniformity among the substrates and to efficiently purge the gas existing between the substrates. Thus, the productivity is improved. In addition, simplification of the structure and downsizing of the apparatus including the processing container are also made possible.

For example, the processing container has a double-tube structure consisting of an inner tube and an outer tube, an upper end of the inner tube and an upper end of the outer tube are closed, the holder is adapted to be contained in the inner tube, and a space formed between the inner tube and the outer tube communicates with the gas-discharging part. In the case, for example, the gas-introducing part has a gas-introducing tube extending in a vertical direction, and a containing groove is formed on an inside surface of the inner tube in order to contain the gas-introducing tube. Alternatively, in the case, the gas-introducing part may have a gas-introducing way provided in the space in a vertical direction. These structures are advantageous in simplifying the entire structure and/or in downsizing the apparatus including the processing container.

In addition, in the case, it is preferable that a minute gap allowing the holder to rotate is adapted to be formed between an inside surface of the inner tube and an outside surface of the holder when the holder is contained in the inner tube. In the case, since the rotation of the holder is allowed, uniformity within each surface of the process may be enhanced. In addition, many processing spaces may be formed (secured) independently in the holder.

In addition, this invention is a substrate processing method of conducting a predetermined thermal process to substrates by using a substrate processing apparatus, the substrate processing apparatus including: a holder that holds substrates in a tier-like manner; a processing container that contains the holder and that conducts a predetermined thermal process to the substrates in a process-gas atmosphere under a predetermined temperature and pressure; a gas-introducing part that introduces a process gas into the processing container; a gas-discharging part that discharges a gas from the processing container to create a predetermined vacuum pressure therein; and a heating part that heats the processing container; wherein the holder is provided with baffle plates each of which forms a processing space for each substrate when the holder is contained in the processing container; the gas-introducing part is provided with gas introduction holes disposed at one lateral side of the respective processing spaces; and the gas-discharging part is provided with gas discharge holes disposed at the other lateral side of the respective processing spaces; oppositely to the gas introduction holes; the substrate processing method comprising: a thermal processing step of forming parallel process-gas flows with respect to the substrates and conducting a predetermined thermal process to the substrates, by introducing the process gas from the gas-introduction holes and discharging the gas from the gas-discharging holes for the respective processing spaces; and a purging step of purging the respective processing spaces after the thermal processing step, by introducing an inert gas from the gas-introduction holes and discharging the gas from the gas-discharging holes.

According to the above invention, in conducting a film-forming process to the surfaces of a large number of substrates to be processed at a time, it is made possible to achieve sufficient film-forming uniformity among the substrates and to efficiently purge the gas existing between the substrates. Thus, the productivity is improved.

Alternatively, this invention is a substrate processing method of conducting a predetermined thermal process to substrates by using a substrate processing apparatus, the substrate processing apparatus including: a holder that holds substrates in a tier-like manner; a processing container that contains the holder and that conducts a predetermined thermal process to the substrates in a process-gas atmosphere under a predetermined temperature and pressure; a gas-introducing part that introduces a process gas into the processing container; a gas-discharging part that discharges a gas from the processing container to create a predetermined vacuum pressure therein; and a heating part that heats the substrates placed in the processing container; wherein the holder is provided with placing plates for placing the substrates, each placing plate being formed as a circular baffle plate for forming a processing space for each substrate when the holder is contained in the processing container; the gas-introducing part is provided with gas introduction holes disposed at one lateral side of the respective processing spaces; and the gas-discharging part is provided with gas discharge holes disposed at the other lateral side of the respective processing spaces, oppositely to the gas introduction holes; the substrate processing method comprising: a thermal processing step of forming parallel process-gas flows with respect to the substrates and conducting a predetermined thermal process to the substrates, by introducing the process gas from the gas-introduction holes and discharging the gas from the gas-discharging holes for the respective processing spaces; and a purging step of purging the respective processing spaces after the thermal processing step, by introducing an inert gas from the gas-introduction holes and discharging the gas from the gas-discharging holes.

According to the above invention as well, in conducting a film-forming process to the surfaces of a large number of substrates to be processed at a time, it is made possible to achieve sufficient film-forming uniformity among the substrates and to efficiently purge the gas existing between the substrates. Thus, the productivity is improved.

In addition, a control program to be executed by a computer that controls the above processing apparatus so as to achieve the above processing method should be protected by the present application. A storage medium capable of being read by a computer, storing such a control program, also should be protected by the present application.

BRIEF DESCRIPTION OF THE DRAWINGS

FIG. 4 is a schematic longitudinal sectional view showing a vertical thermal processing apparatus according to a second embodiment of the present invention;

BEST MODE FOR CARRYING OUT THE INVENTION

Hereinafter, a best mode for carrying out the present invention is explained in details based on attached drawings.

Figure 1:
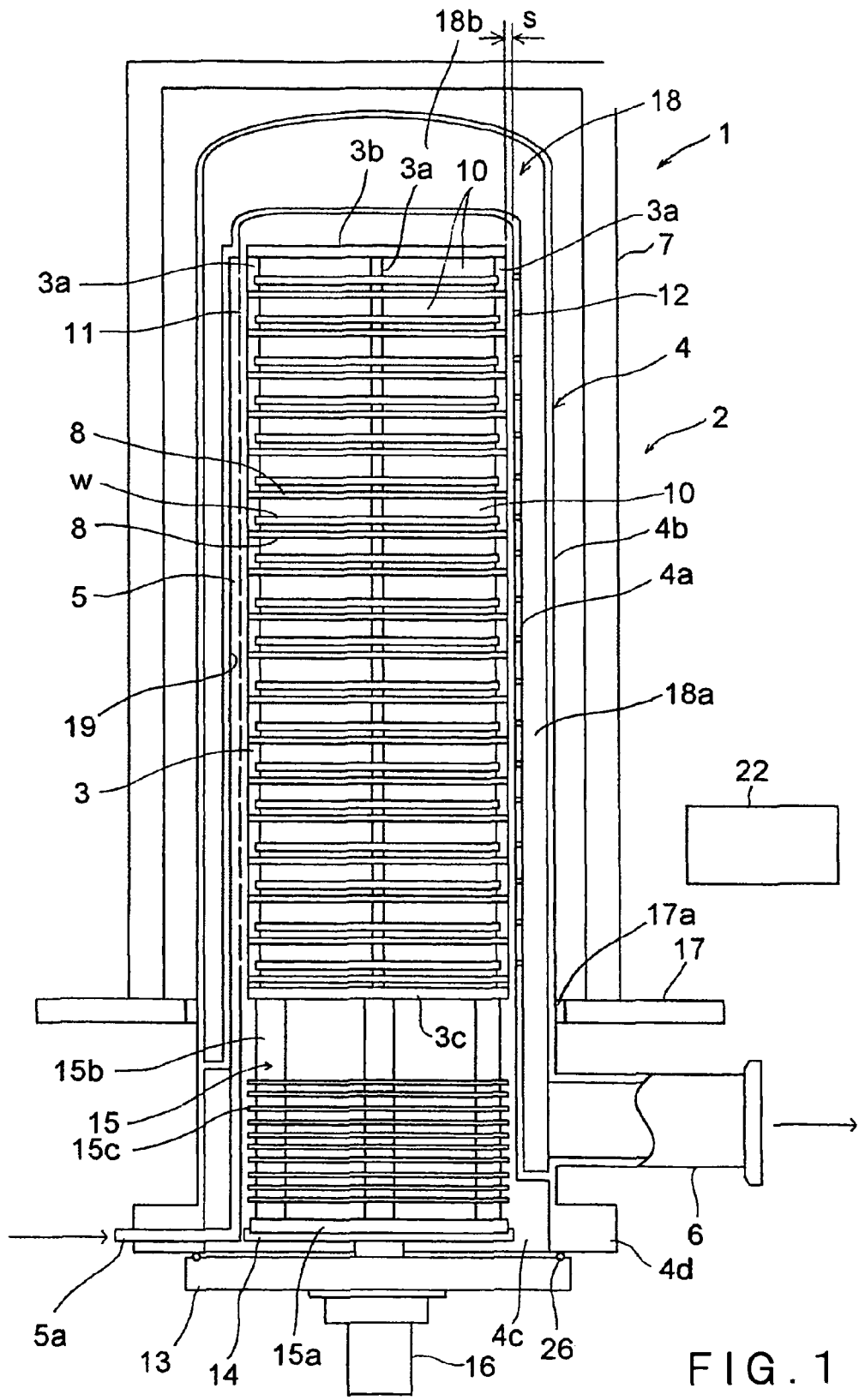
FIG. 1 is a schematic longitudinal sectional view showing a vertical thermal processing apparatus according to a first embodiment of the present invention.
Figure 2:
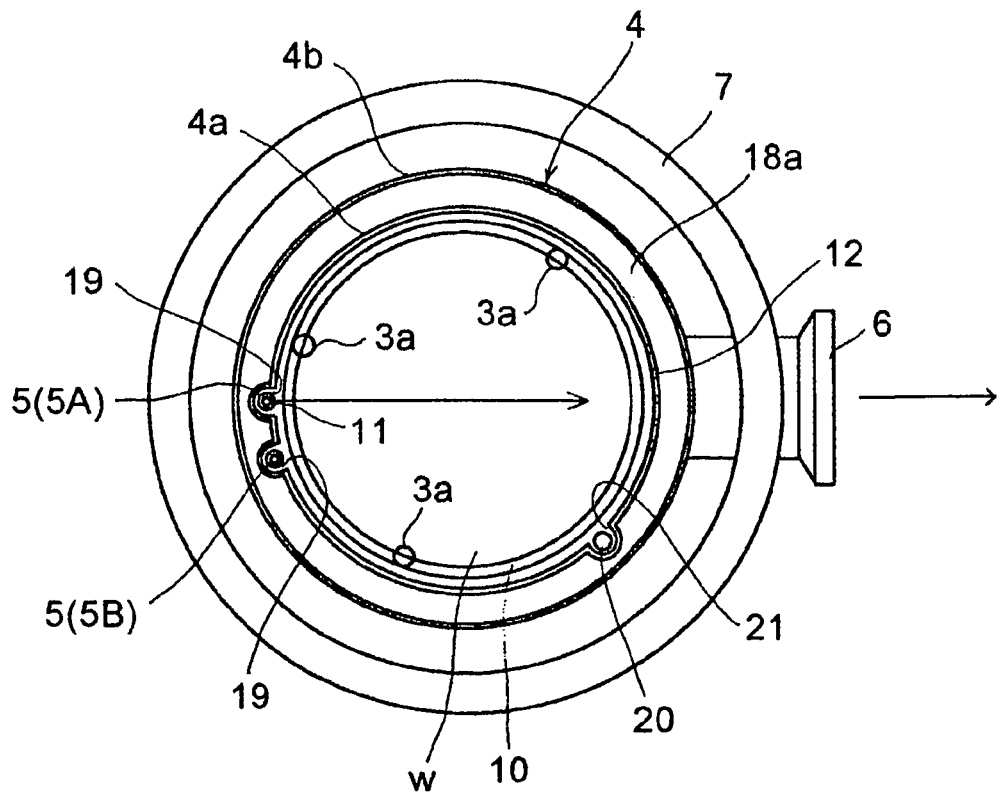
FIG. 2 is a schematic transversal sectional view of the vertical thermal processing apparatus of FIG. 1.
Figure 3:
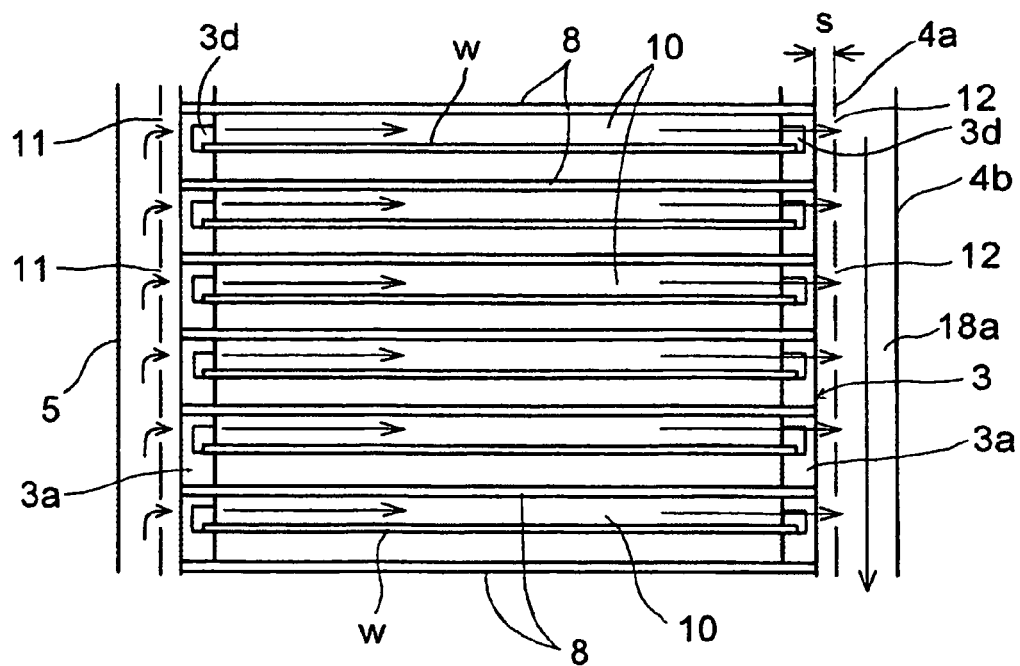
FIG. 3 is an enlarged sectional view of a main part of the vertical thermal processing apparatus of FIG. 1.

FIG. 1 is a schematic longitudinal sectional view showing a vertical thermal processing apparatus according to a first embodiment of the present invention. FIG. 2 is a schematic transversal sectional view of the vertical thermal processing apparatus of FIG. 1. FIG. 3 is an enlarged sectional view of a main part of the vertical thermal processing apparatus of FIG. 1.

As shown in FIG. 1, the vertical thermal processing apparatus 1, which is a semiconductor manufacturing apparatus (processing apparatus), comprises a vertical furnace (vertical thermal-processing furnace) 2. The vertical furnace 2 consists of: a boat (holder) 3, for example made of quartz, that holds substrates such as semiconductor wafers w in a vertical tier-like manner at predetermined intervals; a reaction tube (processing container) 4, for example made of quartz, that contains the boat 3 and that conducts a predetermined thermal process, such as a film-forming process by means of a CVD, to the wafers w in a process-gas atmosphere under a predetermined temperature and pressure; a gas-injector (gas-introducing tube) 5 as a gas-introducing part that introduces a process gas into the reaction tube 4; a gas-discharging port as a gas-discharging part that discharges a gas from the reaction tube 4 to create a predetermined vacuum pressure therein; and a heater (heating part) 7 that heats the reaction tube 4.

In the boat 3, processing spaces 10 are formed by divided by baffle plates 8 for the respective wafers w, as spaces (substrate-placing spaces) for placing the respective wafers independently (under a condition separated from the other wafers w). The gas-injector 5 as a gas-introducing part has a gas-introducing hole 11 for each processing space 10. Each gas-introducing hole 11 introduces the gas from one lateral side of the processing space 10. On the other hand, the gas-discharging port 6 as a gas-discharging part communicates with gas-discharging holes 12 provided for the respective processing spaces 10 oppositely to the respective gas-introduction holes 11. As shown in FIGS. 2 and 3, the boat 3 has a plurality of, for example three columns 3a, a top plate 3b provided at upper ends of the columns 3a, and a bottom plate 3c provided at lower ends of the columns 3a. Supporting grooves 3d for horizontally supporting peripheral parts of the wafers w are formed in the columns 3a at predetermined pitches in a vertical direction. Herein, each supporting groove 3d has a predetermined height in such a manner that the wafer can move in a vertical direction in the groove when the wafer is transferred.

The boat 3 is capable of holding a large number of, for example 50 wafers w, whose diameter is for example 300 mm. Each baffle plate 8 is made of quartz, has a circular shape and is arranged horizontally. Then, the baffle plates 8 are provided in the boat 3 at predetermined pitches (intervals) in a vertical direction between the top plate 3b and the bottom plate 3c, so as to form the processing spaces 10 for the respective wafers w. The size of the baffle plate 8 is preferably the same as or substantially the same as a circumcircle of the columns 3a. An under surface of each wafer w is supported by a fork of a transferring mechanism not shown. Thus, each wafer w is transferred into or from the supporting groove 3d of the boat 3.

The boat 3 is placed, via a rotatable table 14 and a heat-shielding stage 15, on a lid member 13 that can close a furnace opening 4c at a lower end of the reaction tube 4. A rotation drive mechanism 16 for driving the rotatable table 14 is provided at a lower portion of the lid member 13. The heat-shielding stage 15 placed on the rotatable table 14 mainly consists of: a lower plate 15a placed on the rotatable table 14; a plurality of columns 15b standing from on the lower plate 15a; and a large number of heat-shielding plates 15c provided in a vertical tier-like manner at predetermined pitches between the columns 15b.

The lid member 13 is made of stainless steel, for example. A sealing member such as an O-ring 26 for hermetically sealing the furnace opening 4c at a lower end of the reaction tube 4 by contacting with the same is provided on an upper surface portion of the lid member 13. It is preferable that a surface exposed in the furnace of the upper surface portion of the lid member 13 is provided with a protection cover (not shown) made of quartz, for example, which is corrosion resistant. The lid member 13 is vertically movable by means of an elevating mechanism not shown. When the lid member 13 is moved upward, the boat 3 is loaded into the reaction tube 4 and the furnace opening 4c is closed. When the lid member 13 is moved downward, the furnace opening 4c is opened and the boat 3 is unloaded from the reaction tube 4 to a lower loading area.

The reaction tube 4 has a double-tube structure consisting of an inner tube 4a and an outer tube 4b. The inner tube 4a and the outer tube 4b are integrated and their upper ends are respectively closed (they have respectively a ceiling part). The boat 3 is adapted to be contained in the inner tube 4a. Lower ends of the inner tube 4a and the outer tube 4b are commonly opened. An outward flange portion 4d is formed at a lower end portion of the outer tube 4b. The flange portion 4d is supported by a base plate 17 via a flange cap member and/or an attachment member, not shown. Thus, the reaction tube 4 is attached to the base plate 17 under a condition wherein the reaction tube 4 passes through an opening part 17a of the base plate 17. In addition, the heater 7 is disposed on the base plate 17. The heater 7 consists of: a cylindrical heat-shielding body surrounding the reaction tube 4; and a heating resister arranged inside the heat-shielding body (detailed structure is not shown).

A lower end portion of the inner tube 4a is also formed into an outward flange portion, which is hermetically attached to an inside surface of the outer tube 4b. Thus, a space 18 is formed between the inner tube 4a and the outer tube 4b. In details, the space 18 consists of a circular space portion 18a and a ceiling space portion 18b. The circular space portion 18a and the ceiling space portion 18b communicate with each other. Herein, the entire lower end of the inner tube 4a doesn't have to be the same height. For example, as shown in FIG. 1, the height thereof on one side (right side) may be lower than the height thereof on the other side (left side), in order to adapt to the gas-discharging port 6, so that there is formed a slope from the one side to the other side.

In the present embodiment, as a gas-introduction part, the gas-injector 5 is used, which is a standing gas-introducing tube (extending in a vertical direction). An upper end portion of the gas-injector 5 is closed, and a proximal end portion 5a thereof is bent in an L-shape so as to horizontally pierce through the flange portion 4d of the reaction tube 4. The proximal end portion 5a of the gas-injector 5 is connected to a gas-supplying tube that can selectively supply one of a process gas and a purge gas in a switchable manner. The gas-supplying tube is provided with control valves (for example, mass flow controllers) that control flow rates of the respective gases (not shown).

A plurality of gas-injectors 5 (two in the example of FIG. 2 (5A, 5B)) may be provided depending on the kinds of the gases. The plurality of gas-injectors 5 is preferably juxtaposed. Gas-introducing holes 11 are provided on a lateral side of the gas-injector 5, correspondingly to the respective processing spaces 10 of the boat 3, toward the same. Thus, the process gas or the purge gas is ejected by the respective gas-introducing holes 11 from one side of the respective processing spaces 10 toward the other side thereof. In the present case, the process gas or the purge gas is ejected from the gas-introducing holes 11 above the wafers w, and flows parallel to the upper surfaces of the respective wafers w. Herein, an aperture of each gas-introducing hole 11 is preferably within a range of 0.5 to 1 mm, for example 0.7 mm.

A minute gap s allowing the boat 3 to rotate is formed between an inside surface of the inner tube 4a and an outside surface of the boat 3. The minute gap s is made as small as possible, so that gas-diffusion from each processing space 10 to the adjacent (upper and lower) processing spaces 10 is prevented. Thus, each independent processing space 10 may be secured. In the present case, in order to prevent an increase of the minute gap s between the outside surface of the boat 3 and the inside surface of the inner tube 4a by the existence of the gas-injector 5 arranged between the boat 3 and the inner tube 4a, a containing groove 19 is formed on the inside surface of the inner tube 4a in order to contain the gas-injector 5, as a concave portion.

Based on the same reason, another containing groove 21 is also formed on the inside surface of the inner tube 4a in order to contain a standing rod-like temperature gauge 20 (extending in a vertical direction). The temperature gauge 20 is attached to the lid member 13 under a condition wherein the temperature gauge 20 stands up from the lid member 13, in order to measure a temperature in the furnace at an initialization. The temperature gauge 20 is removed for a normal operation (for a normal processing).

The minute gap s is preferably within a range of 1 to 5 mm. In addition, the heater 7 may be provided with a temperature sensor for measuring its temperature (not shown).

The gas-discharging holes 12 are provided in a side wall of the inner tube 4a, at respective positions oppositely to the gas-introducing holes 11. Each gas is ejected from the gas-introducing hole 11 and diffused within a sector-shaped region in a plan view (when seen from an upper position). Thus, in order to cover a certain width of the side wall of the inner tube 4a, it is preferable that a plurality of gas-discharging holes 12 are formed or that the gas-discharging hole 12 is formed into a slit-like shape. The gas-discharging port 6 forming a gas-discharging part is provided at a lower portion of the side wall of the outer tube 4b on the side of the gas-discharging holes 12, and communicated with the circular space portion 18a. The gas-discharging port 6 is connected to a reduced-pressure gas-discharging system (not shown) including a pressure-controlling mechanism, which has a pressure sensor, a vacuum pump, and a pressure control valve to reduce a pressure in the reaction tube to a predetermined process pressure such as 0.3 to 10 Torr.

The above structured vertical thermal processing apparatus 1 comprises a controlling unit 22 that manages a pressure in the reaction tube 4, a process temperature, introduction amount and time of the process gas or the purge gas, so as to conduct a film-forming process based on a predetermined recipe. For this controlling unit 22, a storage medium storing a computer program used for conducting the following processing method is used (not shown).

Next, as an example of the processing method, an ALD process is explained. At first, the boat 3 on which the wafers w have been placed is loaded into the reaction tube 4, and the furnace opening 4c is closed by the lid member 13. Then, the inside of the reaction tube 4 is vacuumed by the pressure-controlling mechanism, so that a predetermined process pressure is controlled. In addition, the temperature in the furnace is controlled to a predetermined process temperature by the heater. Furthermore, the boat 3 is rotated by the rotation drive mechanism 16.

Under this situation, one process gas such as hexachlorosilane ($Si_2Cl_6$) is caused to flow into the respective processing space 10 from the gas-introducing holes 11 of the one gas-injector 5A. Then, a purge gas is caused to flow into the respective processing space 10 from the gas-introducing holes 11 of the same gas-injector 5A. Next, the other process gas such as ammonia ($NH_3$) is caused to flow into the respective processing space 10 from the gas-introducing holes 11 of the other gas-injector 5B. Then, a purge gas is caused to flow into the respective processing space 10 from the gas-introducing holes 11 of the same gas-injector 5B. Thereafter, in the same manner, a predetermined number of gas-flowing steps of the respective process gases and purging steps for respective predetermined times is repeated, for example an introducing step of the hexachlorosilane, a purging step, an introducing step of the ammonia and a purging step, - - - . The process gases and the purge gas flown to the respective processing spaces 10 are absorbed and discharged from the opposite gas-discharging holes 12.

After the predetermined process is completed, the lid member 13 is moved downward, and the boat 3 holding the wafers w that have been processed is unloaded.

In the above processing method, for each processing space 10 divided and formed for each wafer w in the boat 3, the process gas is introduced from the one lateral side and is discharged from the other lateral side. Thus, the film-forming process may be conducted to the wafers w under a condition wherein the flows of the process gas are formed parallel to the wafers. In addition, after the film-forming process, for each processing space 10 in the boat 3, the purge gas is introduced from the one lateral side and is discharged from the other lateral side, so that each processing space 10 is purged. Therefore, in conducting the film-forming process to the surfaces of a large number of wafers at a time, it is made possible to achieve sufficient film-forming uniformity among the substrates and also to efficiently purge the gas existing between the substrates. Thus, efficiency and productivity of the process are improved.

In addition, in the above vertical thermal processing apparatus (processing apparatus), each processing space 10 is divided and formed by each baffle 8 for each wafer w in the boat 3, the gas-introducing holes 11 are arranged on the one lateral side of the processing spaces 10, and the gas-discharging holes 12 are arranged on the other lateral side of the processing spaces 10. Therefore, in conducting the film-forming process to the surfaces of a large number of wafers at a time, it is made possible to achieve sufficient film-forming uniformity among the substrates and also to efficiently purge the gas existing between the substrates. Thus, efficiency and productivity of the process are improved. Furthermore, simplification of the structure and downsizing of the apparatus including the reaction tube 4 are also made possible.

In particular, the reaction tube 4 has the double-tube structure consisting of the inner tube 4*a* and the outer tube 4*b* wherein the inner tube 4*a* and the outer tube 4*b* are integrated and their upper ends are respectively closed, the boat 3 is adapted to be contained in the inner tube 4*a*, the space 18 between the inner tube 4*a* and the outer tube 4*b* is communicated with the gas-discharging port 6 as a gas-discharging part, and the containing groove 19 for containing the standing gas-injector 5 as a gas-introducing part is formed on an inside surface of the inner tube 4*a*. Thus, simplification of the structure and downsizing of the apparatus including the reaction tube 4 are made possible.

Furthermore, since the minute gap s allowing the boat 3 to rotate is formed between the inside surface of the inner tube 4*a* and the outside surface of the boat 3, the rotation of the boat 3 is allowed while many processing spaces (substrate-placing space) 10 may be secured independently in the boat 3, so that a complete cross flow for each processing space 10 (horizontal flow direction perpendicular to the vertical arrangement direction of the tier-like manner of the wafers w) can be achieved. On the other hand, it is rare that an upper layer of the process gas and a lower layer of the process gas substantially mix with each other via the minute gap s. Thus, it is made possible to achieve sufficient film-forming uniformity among the substrates and also to efficiently purge the gas staying between the substrates. Thus, productivity of the process are improved. Furthermore, simplification of the structure and downsizing of the apparatus including the reaction tube 4 are also made possible.

Figure 5:
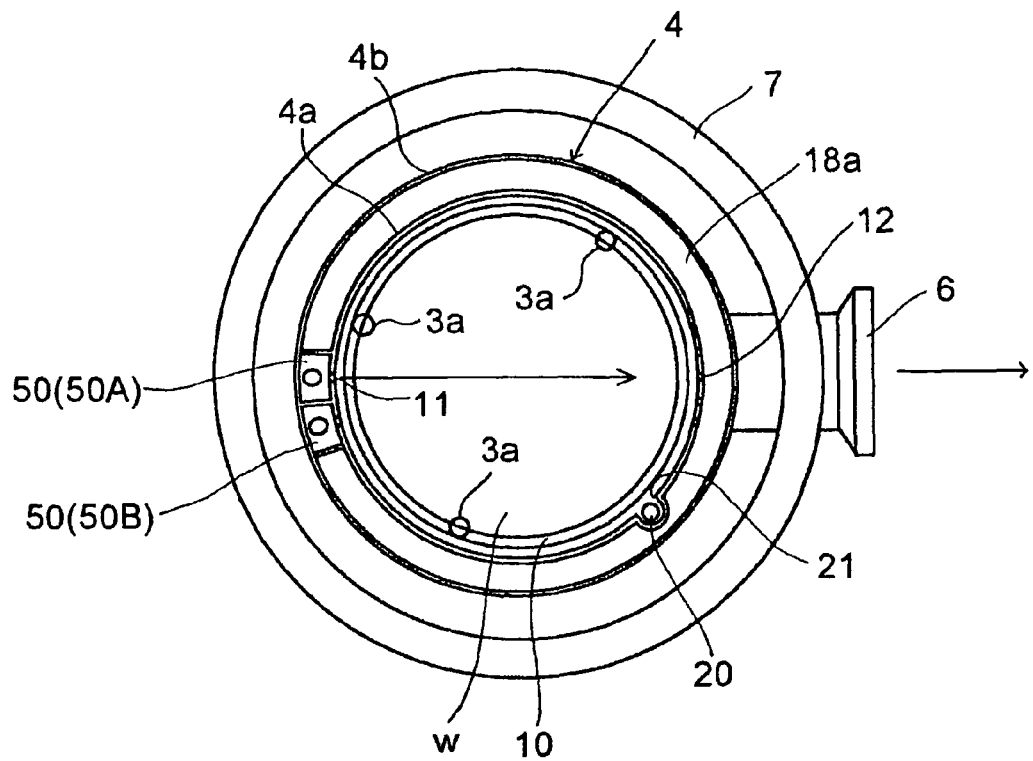
FIG. 5 is a schematic transversal sectional view of the vertical thermal processing apparatus of FIG. 4.
Figure 6:
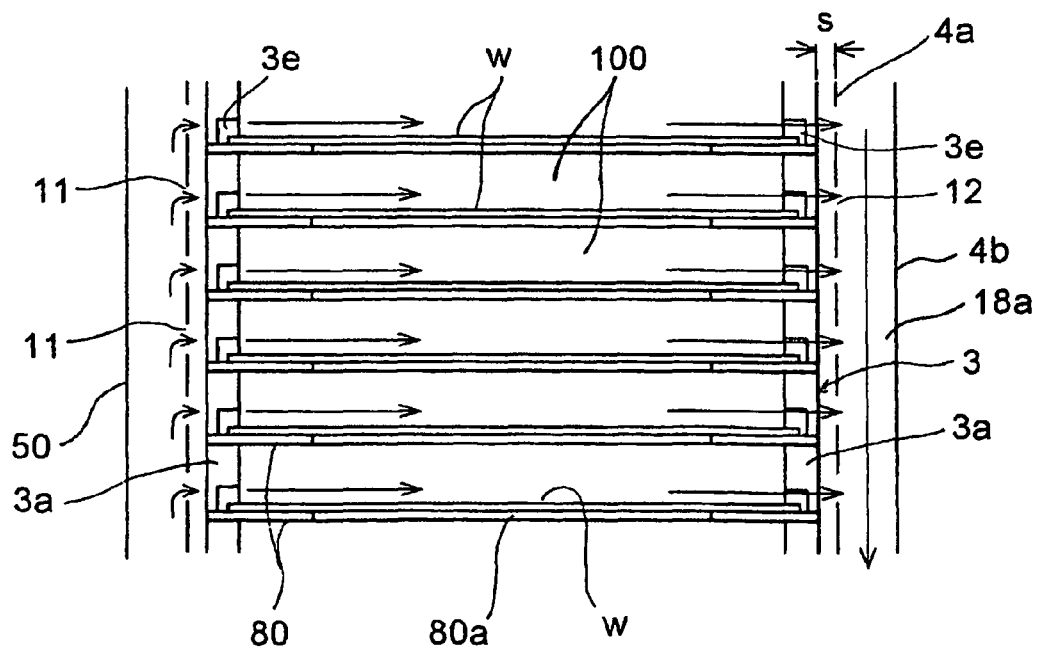
FIG. 6 is an enlarged sectional view of a main part of the vertical thermal processing apparatus of FIG. 4.

Next, FIG. 4 is a schematic longitudinal sectional view showing a vertical thermal processing apparatus according to a second embodiment of the present invention. FIG. 5 is a schematic transversal sectional view of the vertical thermal processing apparatus of FIG. 4. FIG. 6 is an enlarged sectional view of a main part of the vertical thermal processing apparatus of FIG. 4. In the second embodiment, the same part or element as the first embodiment shown in FIGS. 1 to 3 is accompanied with the same numeral signs and explanation thereof is omitted.

In the present embodiment, as a placing plate of the boat 3 for placing a wafer w, a circular baffle plate 80 for forming a processing space 100 divided for each wafer w is adopted. The size of the circular baffle plate 80 is preferably the same as or substantially the same as the circumcircle of the columns 3*a*, in the same manner as the size of the baffle plate 8. Herein, an opening part 80*a* whose size is smaller than the wafer w is provided at a center portion of the circular baffle plate 80. In the same manner as the supporting grooves 3*d*, groove portions 3*e* for horizontally supporting peripheral parts of the wafers w are formed in the columns 3*a* at predetermined pitches in a vertical direction. Herein, each groove portion 3*e* also has a predetermined height in such a manner that the wafer can move in a vertical direction in the groove portion when the wafer is transferred.

When a wafer w is placed on the upper surface of the circular baffle plate 80, the opening part 80*a* at the center portion of the circular baffle plate 80 is closed. Thus, a processing space 100 is secured independently in the vertical direction. In the case, a film is formed on an upper surface of the wafer w, and also is formed on an under surface of the wafer w exposed via the opening part 80*a* of the circular baffle plate 80. Thus, bowing of the wafer is prevented.

For example, a wafer transferring mechanism comprises: a lifting member that lifts up a wafer w placed on the circular fable plate 80 through the opening part 80*a* of the circular fable plate 80; and a fork that can be inserted between the lifted wafer w and the circular baffle plate 80 so as to support and transfer the wafer w (the drawings are omitted).

As a gas-introducing part, a plurality of (two in the example of FIG. 5 (50A, 50B)) gas injection boxes (gas-introducing box) 50 extending in the vertical direction is formed adjacent to each other in the space 18 between the inner tube 4*a* and the outer tube 4*b* of the reaction tube 4. A lower portion of each gas injection box 50 is connected to an L-shaped gas-introducing tube 50*a*, whose proximal end portion horizontally pierces through the flange portion 4*d* of the reaction tube 4. On the other hand, the gas-introducing holes 11 are formed in a wall portion of the inner tube 4*a* forming the gas injection box 50, correspondingly to the respective processing spaces 100. The gas injection box 50 can have a greater cross-sectional area compared with the gas injector 5. Thus, density difference (pressure difference) in the vertical direction of the process gas ejected from the gas-introducing holes 11 can be made smaller. In addition, when the gas injection box 50 is adopted, it is unnecessary to provide the containing groove 19, so that the simplification of the structure is achieved more than the case adopting the gas injector 5.

The vertical thermal processing apparatus 1 of the present embodiment also can carry out the above processing method, and can achieve the same effect as the previous embodiment. In addition, according to the vertical thermal processing apparatus 1 of the present embodiment, since the wafers w are directly placed on the upper surfaces of the circular baffle plates 80, the number of wafers placed on the boat can be increased compared with the previous embodiment.

Figure 7:
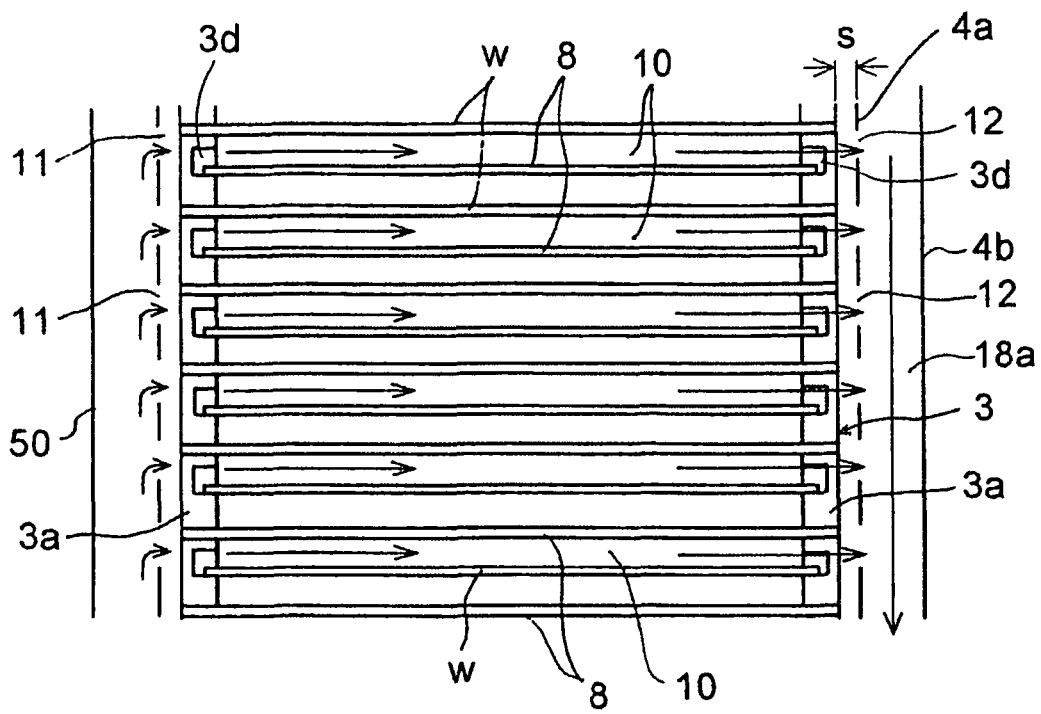
FIG. 7 is an enlarged sectional view of a main part of a further embodiment (variation) of the present invention.
Figure 8:
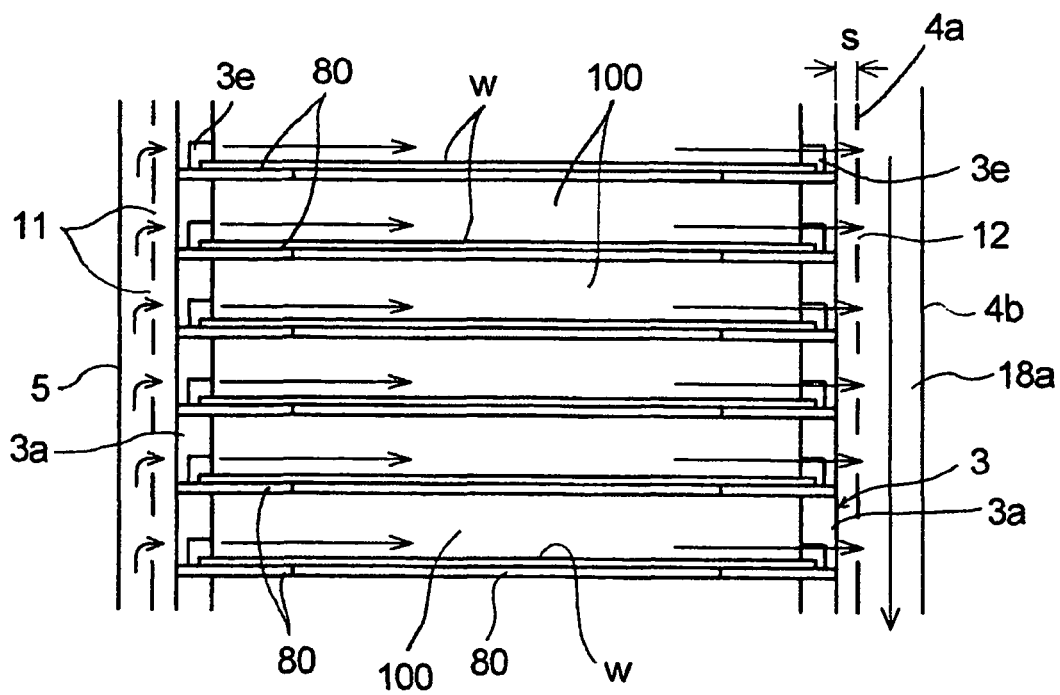
FIG. 8 is an enlarged sectional view of a main part of a further embodiment (variation) of the present invention.

FIGS. 7 and 8 are enlarged sectional views of main parts of further embodiments (variations) of the present invention. As shown in FIG. 7, a boat 3 in which a processing space 10 is formed by a baffle plate 8 for each wafer w can be combined with a processing container adopting a gas injection box 50. As shown in FIG. 8, a boat 3 in which a processing space is formed by a circular baffle plate 80 for each wafer w can be combined with a processing container adopting a gas injector 5.

As described above, the embodiments of the present invention have been explained with reference to the drawings. However, the present invention is not limited to the above embodiments, but may be variously modified in design within a range of the summary of the present invention.

The invention claimed is:
1. A substrate processing apparatus comprising:
a holder that holds substrates in a tier-like manner,
a processing container that contains the holder and that conducts a predetermined thermal process to the substrates in a process-gas atmosphere under a predetermined temperature and pressure,
a gas-introducing part that introduces a process gas into the processing container,
a gas-discharging part that discharges a gas from the processing container to create a predetermined vacuum pressure therein, and
a heating part that heats the processing container,
wherein
the holder is provided with baffle plates each of which forms a processing space for each substrate when the holder is contained in the processing container,
the gas-introducing part is provided with gas introduction holes disposed at one lateral side of the respective processing spaces, the gas-discharging part is provided with gas discharge holes disposed at the other lateral side of the respective processing spaces, oppositely to the gas introduction holes, the processing container has a double-tube structure consisting of an inner tube and an outer tube, an upper end of the inner tube and an upper end of the outer tube are closed, the holder is adapted to be contained in the inner tube, a space formed between the inner tube and the outer tube communicates with the gas-discharging part, the gas-introducing part has a gas-introducing tube extending in a vertical direction, a containing groove is formed on an inside surface of the inner tube in order to contain the gas-introducing tube, and a minute gap is adapted to be formed between an inside surface of the inner tube and an outside surface of the holder when the holder is contained in the inner tube, the minute gap allowing the holder to rotate but being made as small as possible such that gas-diffusion from each processing space to the adjacent upper and lower processing spaces is prevented.

2. A substrate processing apparatus comprising:

a holder that holds substrates in a tier-like manner, a processing container that contains the holder and that conducts a predetermined thermal process to the substrates in a process-gas atmosphere under a predetermined temperature and pressure, a gas-introducing part that introduces a process gas into the processing container, a gas-discharging part that discharges a gas from the processing container to create a predetermined vacuum pressure therein, and a heating part that heats the substrates placed in the processing container, wherein the holder is provided with placing plates for placing the substrates, each placing plate being formed as a circular baffle plate for forming a processing space for each substrate when the holder is contained in the processing container, the gas-introducing part is provided with gas introduction holes disposed at one lateral side of the respective processing spaces, the gas-discharging part is provided with gas discharge holes disposed at the other lateral side of the respective processing spaces, oppositely to the gas introduction holes, the processing container has a double-tube structure consisting of an inner tube and an outer tube, an upper end of the inner tube and an upper end of the outer tube are closed, the holder is adapted to be contained in the inner tube, a space formed between the inner tube and the outer tube communicates with the gas-discharging part, the gas-introducing part has a gas-introducing tube extending in a vertical direction, a containing groove is formed on an inside surface of the inner tube in order to contain the gas-introducing tube, and a minute gap is adapted to be formed between an inside surface of the inner tube and an outside surface of the holder when the holder is contained in the inner tube, the minute gap allowing the holder to rotate but being made as small as possible such that gas-diffusion from each processing space to the adjacent upper and lower processing spaces is prevented.

3. A substrate processing method of conducting a predetermined thermal process to substrates by using a substrate processing apparatus, the substrate processing apparatus including:

a holder that holds substrates in a tier-like manner, a processing container that contains the holder and that conducts a predetermined thermal process to the substrates in a process-gas atmosphere under a predetermined temperature and pressure, a gas-introducing part that introduces a process gas into the processing container, a gas-discharging part that discharges a gas from the processing container to create a predetermined vacuum pressure therein, and a heating part that heats the processing container, wherein the holder is provided with baffle plates each of which forms a processing space for each substrate when the holder is contained in the processing container, the gas-introducing part is provided with gas introduction holes disposed at one lateral side of the respective processing spaces, the gas-discharging part is provided with gas discharge holes disposed at the other lateral side of the respective processing spaces, oppositely to the gas introduction holes, the processing container has a double-tube structure consisting of an inner tube and an outer tube, an upper end of the inner tube and an upper end of the outer tube are closed, the holder is adapted to be contained in the inner tube, a space formed between the inner tube and the outer tube communicates with the gas-discharging part, the gas-introducing part has a gas-introducing tube extending in a vertical direction, a containing groove is formed on an inside surface of the inner tube in order to contain the gas-introducing tube, and a minute gap is adapted to be formed between an inside surface of the inner tube and an outside surface of the holder when the holder is contained in the inner tube, the minute gap allowing the holder to rotate but being made as small as possible such that gas-diffusion from each processing space to the adjacent upper and lower processing spaces is prevented, the substrate processing method comprising:

a thermal processing step of forming parallel process-gas flows with respect to the substrates and conducting a predetermined thermal process to the substrates, by introducing the process gas from the gas-introduction holes and discharging the gas from the gas-discharging holes for the respective processing spaces, and a purging step of purging the respective processing spaces after the thermal processing step, by introducing an inert gas from the gas-introduction holes and discharging the gas from the gas-discharging holes.

4. A substrate processing method of conducting a predetermined thermal process to substrates by using a substrate processing apparatus, the substrate processing apparatus including:

a holder that holds substrates in a tier-like manner, a processing container that contains the holder and that conducts a predetermined thermal process to the substrates in a process-gas atmosphere under a predetermined temperature and pressure, a gas-introducing part that introduces a process gas into the processing container, a gas-discharging part that discharges a gas from the processing container to create a predetermined vacuum pressure therein, a heating part that heats the substrates placed in the processing container, the processing container has a double-tube structure consisting of an inner tube and an outer tube, an upper end of the inner tube and an upper end of the outer tube are closed, the holder is adapted to be contained in the inner tube, a space formed between the inner tube and the outer tube communicates with the gas-discharging part, the gas-introducing part has a gas-introducing tube extending in a vertical direction, a containing groove is formed on an inside surface of the inner tube in order to contain the gas-introducing tube, and a minute gap is adapted to be formed between an inside surface of the inner tube and an outside surface of the holder when the holder is contained in the inner tube, the minute gap allowing the holder to rotate but being made as small as possible such that gas-diffusion from each processing space to the adjacent upper and lower processing spaces is prevented, wherein the holder is provided with placing plates for placing the substrates, each placing plate being formed as a circular baffle plate for forming a processing space for each substrate when the holder is contained in the processing container, the gas-introducing part is provided with gas introduction holes disposed at one lateral side of the respective processing spaces, and the gas-discharging part is provided with gas discharge holes disposed at the other lateral side of the respective processing spaces, oppositely to the gas introduction holes, the substrate processing method comprising:

a thermal processing step of forming parallel process-gas flows with respect to the substrates and conducting a predetermined thermal process to the substrates, by introducing the process gas from the gas-introduction holes and discharging the gas from the gas-discharging holes for the respective processing spaces, and a purging step of purging the respective processing spaces after the thermal processing step, by introducing an inert gas from the gas-introduction holes and discharging the gas from the gas-discharging holes.

5. A storage medium capable of being read by a computer, storing a control program to be executed by a computer in order to control a substrate processing apparatus, the substrate processing apparatus including:

a holder that holds substrates in a tier-like manner, a processing container that contains the holder and that conducts a predetermined thermal process to the substrates in a process-gas atmosphere under a predetermined temperature and pressure, a gas-introducing part that introduces a process gas into the processing container, a gas-discharging part that discharges a gas from the processing container to create a predetermined vacuum pressure therein, and a heating part that heats the processing container, wherein the holder is provided with baffle plates each of which forms a processing space for each substrate when the holder is contained in the processing container, the gas-introducing part is provided with gas introduction holes disposed at one lateral side of the respective processing spaces, the gas-discharging part is provided with gas discharge holes disposed at the other lateral side of the respective processing spaces, oppositely to the gas introduction holes, the processing container has a double-tube structure consisting of an inner tube and an outer tube, an upper end of the inner tube and an upper end of the outer tube are closed, the holder is adapted to be contained in the inner tube, a space formed between the inner tube and the outer tube communicates with the gas-discharging part, the gas-introducing part has a gas-introducing tube extending in a vertical direction, a containing groove is formed on an inside surface of the inner tube in order to contain the gas-introducing tube, and a minute gap is adapted to be formed between an inside surface of the inner tube and an outside surface of the holder when the holder is contained in the inner tube, the minute gap allowing the holder to rotate but being made as small as possible such that gas-diffusion from each processing space to the adjacent upper and lower processing spaces is prevented, the control program is adapted to be executed so as to achieve:

a thermal processing step of forming parallel process-gas flows with respect to the substrates and conducting a predetermined thermal process to the substrates, by introducing the process gas from the gas-introduction holes and discharging the gas from the gas-discharging holes for the respective processing spaces, and a purging step of purging the respective processing spaces after the thermal processing step, by introducing an inert gas from the gas-introduction holes and discharging the gas from the gas-discharging holes.

6. A storage medium capable of being read by a computer, storing a control program to be executed by a computer in order to control a substrate processing apparatus, the substrate processing apparatus including:

a holder that holds substrates in a tier-like manner, a processing container that contains the holder and that conducts a predetermined thermal process to the substrates in a process-gas atmosphere under a predetermined temperature and pressure, a gas-introducing part that introduces a process gas into the processing container, a gas-discharging part that discharges a gas from the processing container to create a predetermined vacuum pressure therein, and a heating part that heats the substrates placed in the processing container, wherein the holder is provided with placing plates for placing the substrates, each placing plate being formed as a circular baffle plate for forming a processing space for each substrate when the holder is contained in the processing container, the gas-introducing part is provided with gas introduction holes disposed at one lateral side of the respective processing spaces, the gas-discharging part is provided with gas discharge holes disposed at the other lateral side of the respective processing spaces, oppositely to the gas introduction holes, the processing container has a double-tube structure consisting of an inner tube and an outer tube, an upper end of the inner tube and an upper end of the outer tube are closed, the holder is adapted to be contained in the inner tube, a space formed between the inner tube and the outer tube communicates with the gas-discharging part, the gas-introducing part has a gas-introducing tube extending in a vertical direction, a containing groove is formed on an inside surface of the inner tube in order to contain the gas-introducing tube, and a minute gap is adapted to be formed between an inside surface of the inner tube and an outside surface of the holder when the holder is contained in the inner tube, the minute gap allowing the holder to rotate but being made as small as possible such that gas-diffusion from each processing space to the adjacent upper and lower processing spaces is prevented, the control program is adapted to be executed so as to achieve:

a thermal processing step of forming parallel process-gas flows with respect to the substrates and conducting a predetermined thermal process to the substrates, by introducing the process gas from the gas-introduction holes and discharging the gas from the gas-discharging holes for the respective processing spaces, and a purging step of purging the respective processing spaces after the thermal processing step, by introducing an inert gas from the gas-introduction holes and discharging the gas from the gas-discharging holes.

* * * * *